(12) United States Patent
Brockmeier et al.

(10) Patent No.: US 11,502,190 B2
(45) Date of Patent: Nov. 15, 2022

(54) VERTICAL POWER SEMICONDUCTOR DEVICE, SEMICONDUCTOR WAFER OR BARE-DIE ARRANGEMENT, CARRIER, AND METHOD OF MANUFACTURING A VERTICAL POWER SEMICONDUCTOR DEVICE

(71) Applicant: Infineon Technologies Austria AG, Villach (AT)

(72) Inventors: Andre Brockmeier, Villach (AT); Francisco Javier Santos Rodriguez, Villach (AT); Hans-Joachim Schulze, Taufkirchen (DE)

(73) Assignee: Infineon Technologies Austria AG, Villach (AT)

( * ) Notice: Subject to any disclaimer, the term of this patent is extended or adjusted under 35 U.S.C. 154(b) by 64 days.

(21) Appl. No.: 17/100,189

(22) Filed: Nov. 20, 2020

(65) Prior Publication Data
US 2021/0167195 A1 Jun. 3, 2021

(30) Foreign Application Priority Data
Nov. 29, 2019 (DE) .......................... 102019132527.7

(51) Int. Cl.
| | | |
|---|---|---|
| *H01L 29/739* | (2006.01) | |
| *H01L 29/66* | (2006.01) | |
| *H01L 29/861* | (2006.01) | |
| *H01L 27/06* | (2006.01) | |
| *H01L 29/78* | (2006.01) | |
| *H01L 25/065* | (2006.01) | |

(52) U.S. Cl.
CPC ........ *H01L 29/7397* (2013.01); *H01L 25/065* (2013.01); *H01L 27/0652* (2013.01); *H01L 29/6609* (2013.01); *H01L 29/66666* (2013.01); *H01L 29/7827* (2013.01); *H01L 29/861* (2013.01)

(58) Field of Classification Search
None
See application file for complete search history.

(56) References Cited

U.S. PATENT DOCUMENTS

| | | | |
|---|---|---|---|
| 2007/0215981 A1 | 9/2007 | Schulze et al. | |
| 2016/0104622 A1* | 4/2016 | Oefner | .............. H01L 21/02002 438/459 |
| 2019/0165159 A1* | 5/2019 | Wehrhahn-Kilian | ........................ H01L 29/0696 |

* cited by examiner

*Primary Examiner* — Hsien Ming Lee
(74) *Attorney, Agent, or Firm* — Murphy, Bilak, Homiller, PLLC (57) ABSTRACT

A vertical power semiconductor device is described. The vertical power semiconductor device includes a semiconductor body having a first main surface and a second main surface opposite to the first main surface. A thickness of the semiconductor body between the first main surface and the second main surface ranges from 40 μm to 200 μm. Active device elements are formed in the semiconductor body at the first main surface. Edge termination elements at least partly surround the active device elements at the first main surface. A diffusion region extends into the semiconductor body from the second main surface. A doping concentration profile of the diffusion region decreases from a peak concentration Ns at the second main surface to a concentration Ns/e, e being Euler's number, over a vertical distance ranging from 1 μm to 5 μm.

28 Claims, 8 Drawing Sheets

VERTICAL POWER SEMICONDUCTOR DEVICE, SEMICONDUCTOR WAFER OR BARE-DIE ARRANGEMENT, CARRIER, AND METHOD OF MANUFACTURING A VERTICAL POWER SEMICONDUCTOR DEVICE

TECHNICAL FIELD

The present disclosure is related to semiconductor devices, in particular to vertical power semiconductor devices, a semiconductor wafer or a bare-die arrangement, a carrier, and methods of manufacturing a vertical power semiconductor device.

BACKGROUND

Semiconductor wafers are typically available in standard wafer sizes and/or thicknesses. For example, standard wafer diameters are 2 inch (50 mm), 4 inch (100 mm), 6 inch (150 mm), inch (200 mm) or 12 inch (300 mm). For silicon power semiconductor devices, a standard wafer thickness may be, for example, 725 µm. Attempts have been made to reduce the final thickness of semiconductor material to improve device characteristics. For example, in power semiconductor devices with a vertical load current flow between a front side and a back side, a thinner semiconductor die may result in lower on-state resistance. The thermal budget applied to the thin wafers may complicate the handling and processing of semiconductor wafers that are thinner than standard wafers. For example, an auxiliary carrier may be reversibly bonded to a semiconductor wafer to increase mechanical stability but may also cause additional challenges in process technology.

There is a need to improve vertical power semiconductor devices and manufacturing methods therefor.

SUMMARY

An example of the present disclosure relates to a vertical power semiconductor device. A vertical power semiconductor device includes a semiconductor body having a first main surface and a second main surface opposite to the first main surface. A thickness of the semiconductor body between the first main surface and the second main surface ranges from 40 µm to 200 µm. Active device elements are formed in the semiconductor body at the first main surface. Edge termination elements at least partly surround the active device elements at the first main surface. A diffusion region extends into the semiconductor body from the second main surface. A doping concentration profile of the diffusion region decreases from a peak concentration Ns at the second main surface to a concentration Ns/e, e being Euler's number, over a vertical distance ranging from 1 µm to 5 µm.

Another example of the present disclosure relates to a semiconductor wafer or a bare-die arrangement. The semiconductor wafer or the bare-die arrangement includes a plurality of semiconductor dies, wherein each or some of the plurality of semiconductor dies includes the vertical power semiconductor device as defined above.

Another example of the present disclosure relates to a carrier. The carrier includes a carrier body. The carrier further includes a bonding material on a first main surface of the carrier body. The carrier is configured to be attached to a semiconductor wafer by wafer bonding via the bonding material. Dopants are integrated in a part of the carrier at the first main surface. The dopants are configured to exit, e.g. out diffuse the carrier by thermal processing, and are configured to form n-type or p-type doping in the semiconductor wafer.

Another example of the present disclosure relates to a method of manufacturing a vertical power semiconductor device. The method includes forming active device elements in a semiconductor wafer at a first main surface of the semiconductor wafer. The method further includes forming edge termination elements at least partly surrounding the active device elements at the first main surface. The method further includes reducing a thickness of the semiconductor wafer at a second side opposite to the first main surface. Thereafter, the method further includes bonding the semiconductor wafer to a carrier via the second side. The method further includes introducing dopants from the carrier into the semiconductor wafer through a second main surface of the semiconductor wafer at the second side.

Another example of the present disclosure relates to another method of manufacturing a vertical power semiconductor device. The method includes forming active device elements in a semiconductor wafer at a first main surface of the semiconductor wafer. The method further includes forming edge termination elements at least partly surrounding the active device elements at the first main surface. The method further includes reducing a thickness of the semiconductor wafer at a second side opposite to the first main surface. The method further includes bonding the semiconductor wafer to a carrier via the second side. The method further includes introducing dopants into the semiconductor wafer through a second main surface of the semiconductor wafer at the second side prior to bonding the semiconductor wafer to a carrier via the second side.

An example of the present disclosure relates to another method of manufacturing a vertical power semiconductor device. The method includes forming active device elements in a semiconductor wafer at a first main surface of the semiconductor wafer. Thereafter, the method further includes reducing a thickness of the semiconductor wafer at a second side opposite to the first main surface. Thereafter, the method further includes bonding the semiconductor wafer to a carrier via the second side. Thereafter, the method further includes subjecting the wafer to a thermal treatment of at least 600° C.

An example of the present disclosure relates to another method of manufacturing a vertical power semiconductor device. The method includes forming active device elements in a semiconductor wafer at a first main surface of the semiconductor wafer. The method further includes reducing a thickness of the semiconductor wafer at a second side opposite to the first main surface. Thereafter, the method further includes bonding the semiconductor wafer to a carrier via the second side. Thereafter, the method further includes applying a metallization layer on the first main surface prior to removing the carrier.

Those skilled in the art will recognize additional features and advantages upon reading the following detailed description and on viewing the accompanying drawings.

BRIEF DESCRIPTION OF THE DRAWINGS

The accompanying drawings are included to provide a further understanding of the embodiments and are incorporated in and constitute a part of this specification. The drawings illustrate examples of SiC semiconductor devices and methods of manufacturing a silicon carbide device and together with the description serve to explain principles of the examples. Further examples are described in the following detailed description and the claims.

FIGS. 2A to 6B are schematic top views and cross-sectional views for illustrating examples of carriers.

FIGS. 7A to 9 are schematic cross-sectional views for illustrating methods for manufacturing a power semiconductor device.

DETAILED DESCRIPTION

In the following detailed description, reference is made to the accompanying drawings, which form a part hereof and in which are shown by way of illustrations specific examples in which SiC semiconductor devices and methods of manufacturing a silicon carbide device may be practiced. It is to be understood that other examples may be utilized and structural or logical changes may be made without departing from the scope of the present disclosure. For example, features illustrated or described for one example can be used on or in conjunction with other examples to yield yet a further example. It is intended that the present disclosure includes such modifications and variations. The examples are described using specific language, which should not be construed as limiting the scope of the appending claims. The drawings are not scaled and are for illustrative purposes only. Corresponding elements are designated by the same reference signs in the different drawings if not stated otherwise.

The terms "having", "containing", "including", "comprising" and the like are open, and the terms indicate the presence of stated structures, elements or features but do not preclude the presence of additional elements or features. The articles "a", "an" and "the" are intended to include the plural as well as the singular, unless the context clearly indicates otherwise.

The term "electrically connected" describes a permanent low-resistive connection between electrically connected elements, for example a direct contact between the concerned elements or a low-resistive connection via a metal and/or heavily doped semiconductor material. The term "electrically coupled" includes that one or more intervening element(s) adapted for signal and/or power transmission may be connected between the electrically coupled elements, for example, elements that are controllable to temporarily provide a low-resistive connection in a first state and a high-resistive electric decoupling in a second state. An ohmic contact is a non-rectifying electrical junction with a linear or almost linear current-voltage characteristic.

Ranges given for physical dimensions include the boundary values. For example, a range for a parameter y from a to b reads as a≤y≤b. The same holds for ranges with one boundary value like "at most" and "at least".

The term "on" is not to be construed as meaning only "directly on". Rather, if one element is positioned "on" another element (e.g., a layer is "on" another layer or "on" a substrate), a further component (e.g., a further layer) may be positioned between the two elements (e.g., a further layer may be positioned between a layer and a substrate if the layer is "on" said substrate).

An example of a vertical power semiconductor device may include a semiconductor body having a first main surface and a second main surface opposite to the first main surface. A thickness of the semiconductor body between the first main surface and the second main surface may range from 40 µm to 200 µm. The vertical power semiconductor device may further comprise active device elements in the semiconductor body at the first main surface. The vertical power semiconductor device may further comprise edge termination elements at least partly surrounding the active device elements at the first main surface. The vertical power semiconductor device may further comprise a diffusion region extending into the semiconductor body from the second main surface. A doping concentration profile of the diffusion region may decrease from a peak concentration Ns at the second main surface to a concentration Ns/e, e being Euler's number, over a vertical distance ranging from 1 µm to 5 µm.

The vertical power semiconductor device may be a power semiconductor diode, or a power semiconductor IGBT (insulated gate bipolar transistor), or a power semiconductor transistor such as a power semiconductor IGFET (insulated gate field effect transistor, e.g. a metal oxide semiconductor field effect transistor). The vertical power semiconductor device may be configured to conduct currents of more than 1 A or more than 10 A or even more than 30 A and may be further configured to block voltages between load terminals, e.g. between drain and source of a MOSFET, or between emitter and collector of an IGBT, or between cathode and anode of a diode, in the range of several hundreds of up to several thousands of volts, e.g. 400V, 650V, 1.2 kV, 1.7 kV, 3.3 kV, 4.5 kV, 5.5 kV, 6 kV, 6.5 kV. The blocking voltage may correspond to a voltage class specified in a datasheet of the power semiconductor device, for example.

The semiconductor body may include or consist of a semiconductor material from the group IV elemental semiconductors, IV-IV compound semiconductor material, III-V compound semiconductor material, or II-VI compound semiconductor material. Examples of semiconductor materials from the group IV elemental semiconductors include, inter alia, silicon (Si) and germanium (Ge). Examples of IV-IV compound semiconductor materials include, inter alia, silicon carbide (SiC) and silicon germanium (SiGe). Examples of III-V compound semiconductor material include, inter alia, gallium arsenide (GaAs), gallium nitride (GaN), gallium phosphide (GaP), indium phosphide (InP), indium gallium nitride (InGaN) and indium gallium arsenide (InGaAs). Examples of II-VI compound semiconductor materials include, inter alia, cadmium telluride (CdTe), mercury-cadmium-telluride (CdHgTe), and cadmium magnesium telluride (CdMgTe). For example, the semiconductor body may be a magnetic Czochralski (MCZ) or a float zone (FZ) silicon semiconductor body.

The active device elements may be formed in an active device area of the semiconductor body at the first main surface. The active device area is an area of the semiconductor body where a load current flow enters/exits the semiconductor body through the first main surface. In case of IGFETs or IGBTs, the active device area may include source regions electrically connected to a contact electrode through the first main surface. A source to drain current or emitter to collector current may flow from the contact electrode through the first main surface into the source regions. In case of diodes, the active device area may include anode or cathode regions electrically connected to the contact electrode through the first main surface. An anode to cathode current may flow from the contact electrode through the first main surface into the anode or cathode regions. Thus, the active device area may be restricted to a first part of the first main surface through which load current flow is guided, for example.

The edge termination elements may be formed in an edge termination area, which is an area of the semiconductor body that partly or fully surrounds the active device area. Since pn junctions within the semiconductor body, e.g. pn junctions between a body region and a drift zone of an IGFET or an IGBT or pn junctions between a cathode and an anode region of a diode, are not infinite, but terminate at the edge zones of the semiconductor body, this edge effect limits the device breakdown voltage below the ideal value that is set by the infinite parallel plane junction. Care must be taken to ensure proper and efficient termination of the pn junction at the edge of the semiconductor body. The edge termination area is a measure for ensuring proper and efficient termination of the pn junction.

In the edge termination area, the edge termination structures are formed for lowering the electric field at the edge of the semiconductor body. Depending on the voltage class of the semiconductor device, a lateral dimension of the edge termination area may vary. Semiconductor devices with higher voltage classes typically require larger lateral extensions of their edge termination areas for ensuring proper termination of the pn junction. Examples of edge termination structures in the edge termination area include field plates, junction termination extension (JTE) structures, variation of lateral doping (VLD) structures, for example. Other than the active device area, the edge termination area may be restricted to a second part of the first main surface i) that fully or partly surrounds the first part of the active device area, and ii) through which no load current flow is guided through the first main surface to the contact electrode, and iii) that contributes to the termination of the pn junction. There may be a transition region between the active device area and the edge termination area for electrically connecting the edge termination structure, for example.

The diffusion region extending into the semiconductor body from the second main surface may include dopants introduced into the semiconductor body by a vapor phase diffusion source and/or by a solid phase diffusion source. For example, a Gaussian function or complementary error function may fit to the doping concentration profile of the diffusion region. The doping concentration profile may be determined by any appropriate characterization method, e.g. by Secondary Ion Mass Spectrometry (SIMS) for direct measurements of atom concentrations, and/or by Rutherford Backscattering (RBS) for direct measurements of atom concentrations, and/or by various methods for measuring the conductivity as a function of depth for semiconductors, which corresponds more or less directly to the concentration of doping atoms. For example, capacity as a function of the applied voltage for MOS and junction structures, spreading resistance measurements, or microwave absorption may be used to determine the doping concentration profile of the diffusion region. Fitting the Gaussian function or error function to the experimental values of the doping concentration profile of the diffusion region may be carried out by model fitting of experimental results. One example of model fitting is by the minimization of the least squares. The analysis of experimental results may also be carried out by fitting the models' equations of the physics models, e.g. Fick's laws, to the experimental results in order to obtain the physical parameters relevant for the diffusion region.

For example, the diffusion region may be a rear side emitter region of a power insulated gate bipolar transistor, or an anode or cathode contact region of a power semiconductor diode.

Another example of the present disclosure relates to a semiconductor wafer or a bare-die arrangement comprising a plurality of semiconductor dies. Each or some of the plurality of semiconductor dies comprises the vertical power semiconductor device according to any of the examples above or below.

For example, a diameter of the semiconductor wafer is equal to 200 mm or larger.

Another example of the present disclosure relates to a carrier. The carrier may comprise a carrier body. The carrier may further comprise a bonding material on a first main surface of the carrier body, wherein the carrier is configured to be attached to a semiconductor wafer by wafer bonding via the bonding material. The carrier may further comprise dopants integrated in a first part, e.g. surface part of the carrier at the first main surface. The dopants are configured to exit the carrier by thermal processing, and are configured to form n-type or p-type doping in the semiconductor wafer. For example, the carrier may comprise a second part that is free of the dopants. For example, the second part of the carrier adjoins a second main surface of the carrier opposite to the first main surface. For example, an area at the first surface where the dopants are integrated in the carrier may be larger than 70%, or larger than 80%, or larger than 90% of a total area of the first main surface, for example. In other words, more than 70%, or more than 80% or more than 90% of the first surface is configured as a dopant source, for example.

For example, the dopants may exit the carrier by out-diffusion caused by the thermal processing. For example, boron (B), aluminum (Al), gallium (Ga), indium (In) or any combination thereof may be used for p-type doping in the silicon semiconductor wafer. For example, phosphorus (P), arsenic (As), antimony (Sb), selenium (Se) or Sulphur (S) or any combination thereof may be used for n-type doping in the silicon semiconductor wafer.

For example, the carrier may be disc-shaped having a diameter equal to 200 mm or larger.

For example, the carrier body may include one or more of silicon, borophosphosilicate (BPSG) glass, borosilicate (BSG) glass, phosphosilicate (PSG) glass, boron nitride, doped or undoped polycrystalline silicon, silicon carbide.

For example, the dopants may be included in the bonding material of the carrier. Exemplary materials for the bonding material include any or any combination of, oxides of silicon, nitrides of silicon, metals, polycrystalline silicon. For carriers made of glass, polycrystalline silicon may be used as bonding material, for example.

For example, the dopants may be included in a semiconductor region of the carrier body at the first main surface. For example, the carrier may be a semiconductor carrier including the dopants in a region at the first main surface. According to another example, the carrier may be formed by a material different from semiconductor material, e.g. glass or any other material that has a coefficient of thermal expansion that is adapted to the material of the semiconductor wafer for bonding.

For example, the dopants may be introduced into the carrier by an ion implantation step and/or a diffusion step.

For example, an arrangement of the bonding material on the first main surface of the carrier body includes one or more of a ring or ring segments along a circumference of the carrier body, a pattern of regularly arranged islands, a plurality of stripes arranged in parallel.

For example, the carrier may further comprise a semiconductor layer over the carrier body. The dopants may be included in the semiconductor layer, and the bonding material may be arranged on the semiconductor layer. The carrier may further comprise a diffusion barrier arranged between the semiconductor layer and the carrier body. The diffusion barrier may hinder the dopants from diffusing through the carrier which may be undesired, e.g. because the dopants may then not be available for doping of a semiconductor wafer. As an example, a diffusion barrier made of or including SiC may be used for platinum (Pt) doping, e.g. during a life-time killing adjustment of a high power diode, for example.

Another example of the present disclosure relates to a method of manufacturing a vertical power semiconductor device. The method may comprise forming active device elements in a semiconductor wafer at a first main surface of the semiconductor wafer. The method may further comprise forming edge termination elements at least partly surrounding the active device elements at the first main surface. The method may further comprise reducing a thickness of the semiconductor wafer at a second side opposite to the first main surface. After the step of reducing the thickness, the method may further comprise bonding the semiconductor wafer to a carrier via the second side. The method may further comprise introducing dopants from the carrier into the semiconductor wafer through a second main surface of the semiconductor wafer at the second side.

For example, the carrier and the semiconductor substrate may be connected by direct bonding or by reactive bonding. Adhesion between directly bonded layers and substrates may be based on chemical bonds, hydrogen bonds, metallic bonds, ionic bonds and/or covalent bonds, for example. Direct bonding may include exerting a physical force pressing the semiconductor substrate and the handle substrate against each other, a thermal treatment of at least one of the bonded surfaces at moderate temperature or a combination of both (fusion bonding, thermo-compressive bonding, bonding by atomic rearrangement). Direct bonding may include the absence of any additional intermediate layer, for example, of an adhesive layer. An adhesion layer, e.g. a nitride layer, may be arranged at the interface where the handle substrate and the semiconductor substrate are attached to one another, for example.

The dopants may exit the carrier, e.g. by a thermal out-diffusion process, and enter the semiconductor wafer by diffusion in a state where the carrier is bonded to the semiconductor wafer. Thus, the carrier not only functions as a mechanical support for the thinned semiconductor wafer, but also, e.g. at the same time, functions as a doping source for introducing dopants into the semiconductor wafer, e.g. for forming any kind of doped regions at a rear side of the semiconductor wafer such as emitter regions of power IGBTs or power diodes or field stop zones. This may allow for increasing depth, electrically active doping dose and homogeneity of rear side emitters and/or field stop zones of power semiconductor devices, for example. Hence, improved electric characteristics of power semiconductor devices may be achieved, e.g. improved short-circuit robustness and/or improved overcurrent turn-off capability.

For example, the thickness of the semiconductor wafer may be reduced by removing material of the semiconductor wafer from the second side of the semiconductor wafer. The material may be removed by any material removal technique, e.g. abrasive machining processes such as grinding, chemical material removal such as e.g. etching, or chemical mechanical polishing (CMP). Patterning of masks, e.g. resist masks or hard masks may allow for excluding certain areas of the wafer from material removal, e.g. a ring at a circumference of the semiconductor wafer.

For example, the thickness of the semiconductor wafer may be reduced by separating the wafer in a first part and a second part by a wafer split process, e.g. by a so-called cold-split and/or smart cut process.

For example, the vertical power semiconductor device may be a vertical power semiconductor device as described above or below, and the diffusion region may be formed by introducing the dopants from the carrier into the semiconductor wafer. For example, the carrier may be a carrier as described in any of the examples above or below.

For example, the method may further comprise separating the semiconductor wafer from the carrier by at least one etch process removing at least part of a bonding material. For example, an etch solution may weaken a bond between the semiconductor wafer and the carrier by removing the bonding material from an outer circumference of a bonding interface toward a center of the bonding interface, for example. For example, the bonding material on the carrier may be formed in such an arrangement or shape that allows an etch solution to be guided toward a center of the carrier. For example, channels may be formed at a bonding interface between the semiconductor carrier and the carrier. Exemplary arrangements of the bonding material on the carrier may include, inter alia, separate islands and parallel stripes.

For example, the thickness of the semiconductor wafer may be reduced in a central region of the semiconductor wafer, thereby maintaining a thickness of a ring or ring segments of the semiconductor wafer at a circumference of the semiconductor wafer. The ring or ring segments may contribute to mechanical stability of the thinned semiconductor wafer, for example.

For example, the method may further comprise attaching a mechanical support element on the first main surface of the semiconductor wafer.

Another example of the present disclosure relates to another method of manufacturing a vertical power semiconductor device. The method may comprise forming active device elements in a semiconductor wafer at a first main surface of the semiconductor wafer. The method may further comprise forming edge termination elements at least partly surrounding the active device elements at the first main surface. The method may further comprise reducing a thickness of the semiconductor wafer at a second side opposite to the first main surface. The method may further comprise bonding the semiconductor wafer to a carrier via the second side, e.g. after the process of reducing the thickness of the semiconductor wafer at the second side. The method may further comprise introducing dopants into the semiconductor wafer through a second main surface of the semiconductor wafer at the second side prior to bonding the semiconductor wafer to a carrier via the second side. After the bonding step, the method may further comprise subjecting the wafer to a thermal treatment of at least 600° C.

For example, the dopants may be introduced into the second main surface of the semiconductor wafer by ion implantation.

Another example of the present disclosure relates to another method of manufacturing a vertical power semiconductor device. The method may comprise forming active device elements in a semiconductor wafer at a first main surface of the semiconductor wafer. Thereafter, the method may further comprise reducing a thickness of the semiconductor wafer at a second side opposite to the first main surface. Thereafter, the method may further comprise bonding the semiconductor wafer to a carrier via the second side. Thereafter, the method may further comprise subjecting the wafer to a thermal treatment of at least 600° C.

Another example of the present disclosure relates to another method of manufacturing a vertical power semiconductor device. The method may comprise forming active device elements in a semiconductor wafer at a first main surface of the semiconductor wafer. The method may further comprise reducing a thickness of the semiconductor wafer at a second side opposite to the first main surface. Thereafter, the method may further comprise bonding the semiconductor wafer to a carrier via the second side. Thereafter, a metallization layer may be applied on the first main surface prior to removing the carrier. Prior to removing the carrier, at least one metallization layer and optional interlayer dielectric layers as well as imide layer(s) may be applied, for example.

For example, a diameter of the semiconductor wafer may be equal to 200 mm or larger.

The examples and features described above and below may be combined.

In the following, further examples of methods and power semiconductor devices described herein are explained in detail in connection with the accompanying drawings. Functional and structural details described with respect to the examples above shall likewise apply to the exemplary embodiments illustrated in the figures and described further below.

Figure 1:
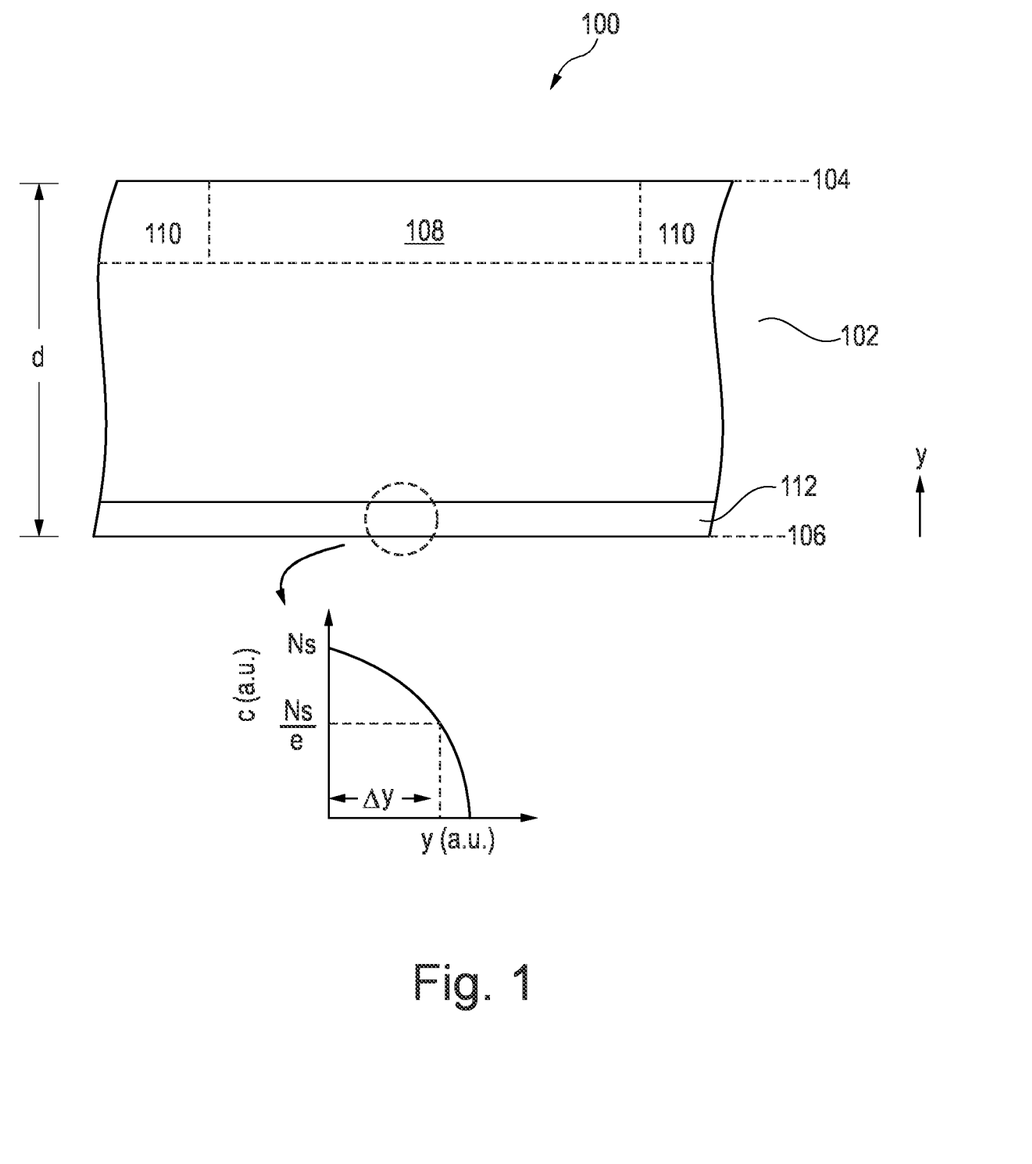
FIG. 1 is a schematic cross-sectional view for illustrating an example of a power semiconductor device.

FIG. 1 is a schematic cross-sectional view illustrating an embodiment of a vertical power semiconductor device 100. The vertical power semiconductor device 100 includes a semiconductor body 102 having a first main surface 104 and a second main surface 106 opposite to the first main surface 104. A thickness d of the semiconductor body 102 between the first main surface 104 and the second main surface 106 ranges from 40 μm to 200 μm. Active device elements 108 are formed in the semiconductor body 102 at the first main surface 104. The active device elements 108 are illustrated in a simplified manner by a dashed box defining a portion of the semiconductor body 102, e.g. an active area, where the active device elements 108 are located. Depending on the type of power semiconductor device, e.g. IGBT or IGFET or diode, the active device elements may comprise n- and/or p-doped semiconductor regions of specific doping and arrangement, for example.

Edge termination elements 110 at least partly surround the active device elements 108 at the first main surface 104. The edge termination elements 110 are illustrated in a simplified manner by dashed boxes defining a portion of the semiconductor body, e.g. an edge termination area, where the edge termination elements 110 are located. Examples of the edge termination elements 110 are field plates, junction termination extension (JTE) structures, variation of lateral doping (VLD) structures, for example.

A diffusion region 112 extends into the semiconductor body 102 from the second main surface 106. A doping concentration profile c of the diffusion region 112 versus a vertical direction y is schematically illustrated in a graph below the cross-section. The doping concentration profile c decreases from a peak concentration Ns at the second main surface 106 to a concentration Ns/e, e being Euler's number, over a vertical distance Δy ranging from 1 μm to 5 μm, or from 2 μm to 5 μm.

The doping concentration profile c of the diffusion region 112 differs from typical rear side diffusion profiles manufactured by laser activation of ultra-shallow junctions with respect to profile shape and profile depth, for example. Since the diffusion region 112 may include dopants introduced into the semiconductor body 102 by a vapor phase diffusion source and/or by a solid phase diffusion source, a Gaussian function or complementary error function may fit to the doping concentration profile of the diffusion region 112. Since a wiring area above the first main surface 104 is not yet formed when introducing the dopants via the second main surface 106 for forming the diffusion region 112, high temperature processes, e.g. thermal processing above 600° C., may be applied for forming the diffusion region 112. Thereby, a desired doping profile and depth may be achieved compared with process technologies that are limited in thermal budget due to front side metallization layer(s) that is (are) already present when the thinned semiconductor wafers are processed at the second main surface 106, for example.

FIGS. 2A to 6B are schematic top views and schematic cross-sectional views for illustrating examples of carriers 200.

Each of the carriers 200 includes a carrier body 202 and a bonding material 204 on a first main surface 208 of the carrier body 202. The carrier 200 is configured to be attached to a semiconductor wafer by wafer bonding via the bonding material 204. Exemplary structural and functional details of the carrier body and the bonding material as described with reference to the examples above likewise apply to the examples illustrated in the figures.

Dopants may be integrated in the bonding material 204 of the carrier 200 and/or in a semiconductor region of the carrier body 202 at the first main surface 208 of the carrier 200.

Figure 2A:
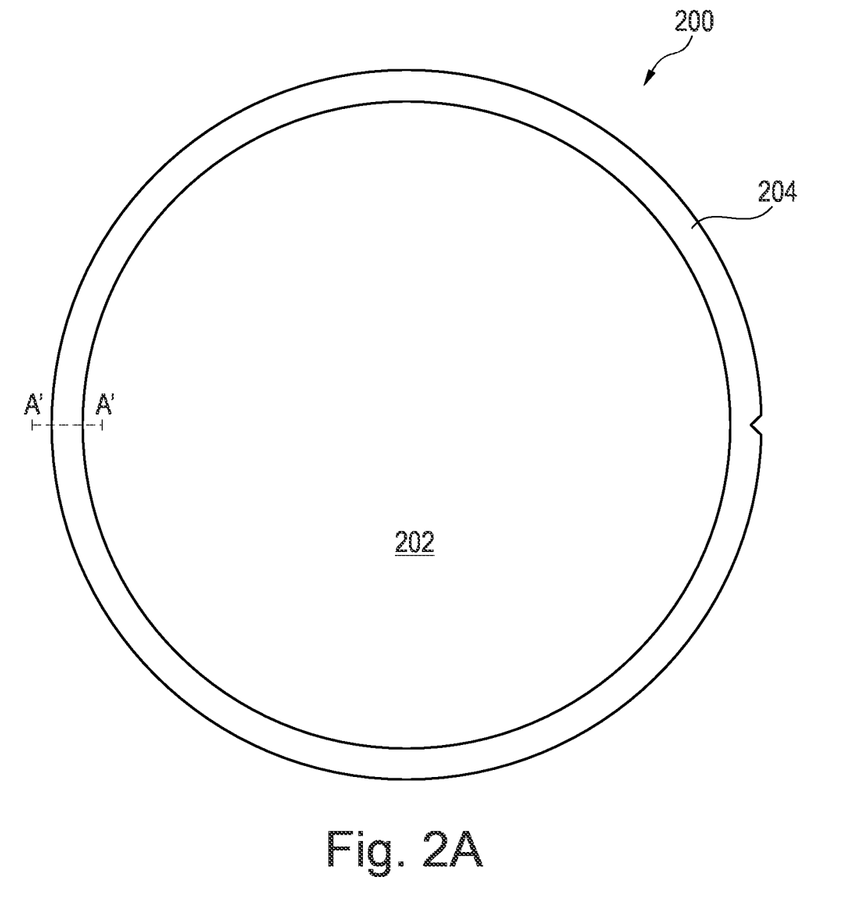
Figure 2B:
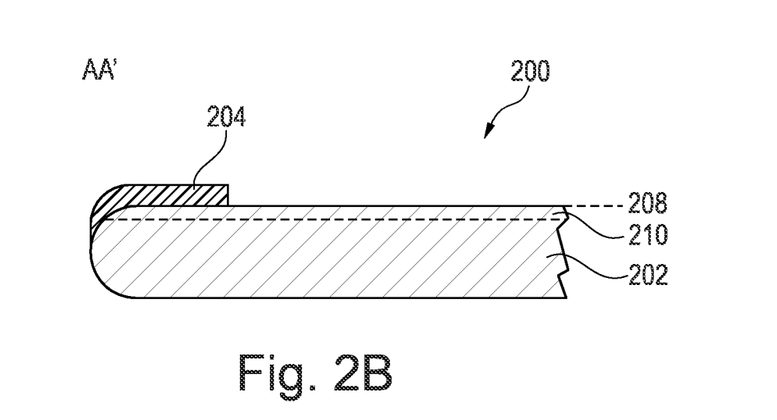

Referring to the example illustrated in the schematic top view of FIG. 2A and the corresponding cross-sectional view of FIG. 2B, the bonding material 204 is arranged along an edge of the carrier body 202. For example, the bonding material 204 may be shaped as a ring on a semiconductor wafer extending along a circumference of the semiconductor wafer. In the example illustrated in FIGS. 2A, 2B, the dopants may be integrated in a semiconductor region 210 of the carrier body 202 at the first main surface 208. For example, the dopants may be introduced into the carrier body 202 by one or more ion implantation processes and/or diffusion processes, for example.

Figure 3A:
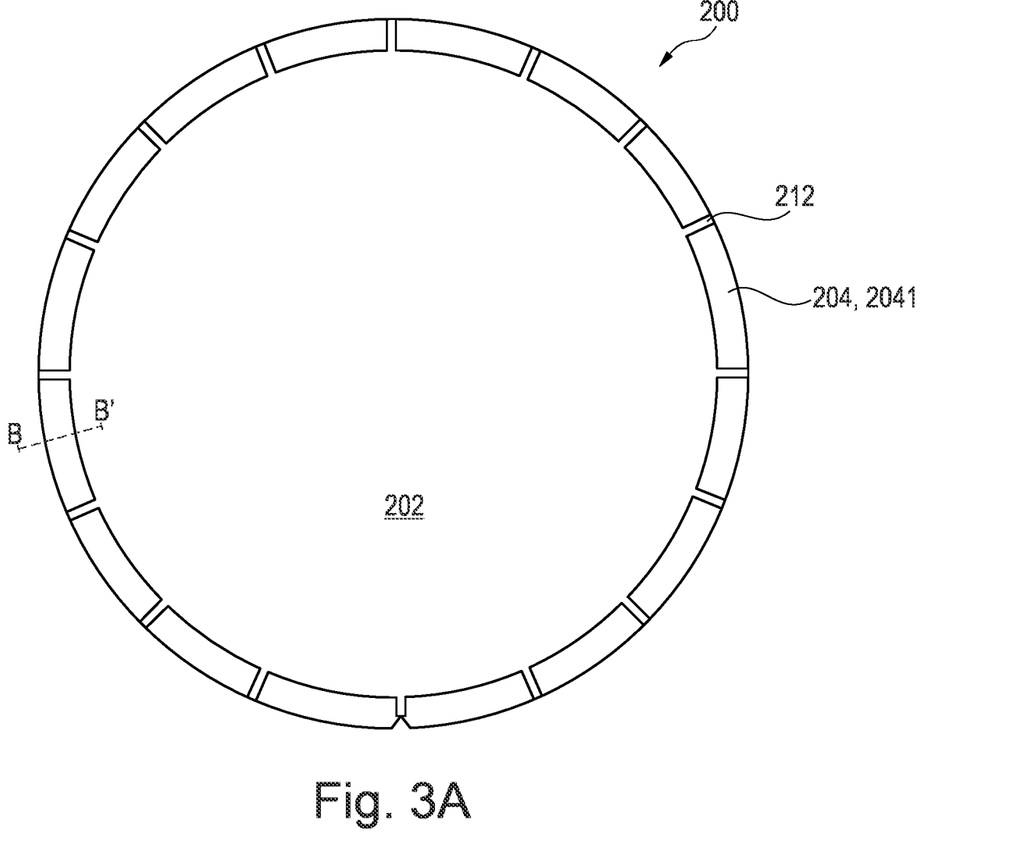
Figure 3B:
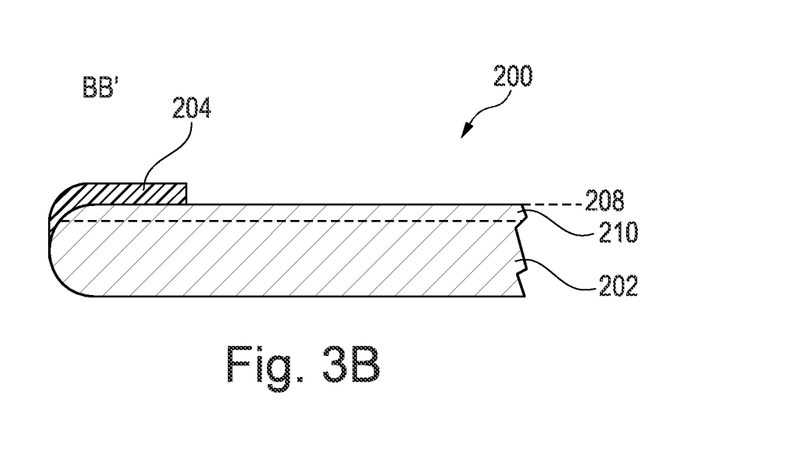

Referring to the example illustrated in the schematic top view of FIG. 3A and the corresponding cross-sectional view of FIG. 3B, the bonding material 204 is also arranged along the edge of the carrier body 202 similar to the example of FIGS. 2A, 2B. However, the bonding material 204 is arranged as a sequence of ring segments 2041 separated from one another by channels 212. Dimensions of the channels 212 may be equal or may differ from one another. Likewise, dimensions of the ring segments 2041 of the bonding material 204 may be equal or may differ from one another. Dimensions and arrangement of the ring segments 2041 and the channels 212 may be adjusted for achieving desired bonding properties and separation or detachment properties between the carrier 200 and a semiconductor wafer. For example, an etch solution may flow through the channels 212 for etching the bonding material 204 when separating the carrier 202 and from a semiconductor wafer.

Figure 4A:
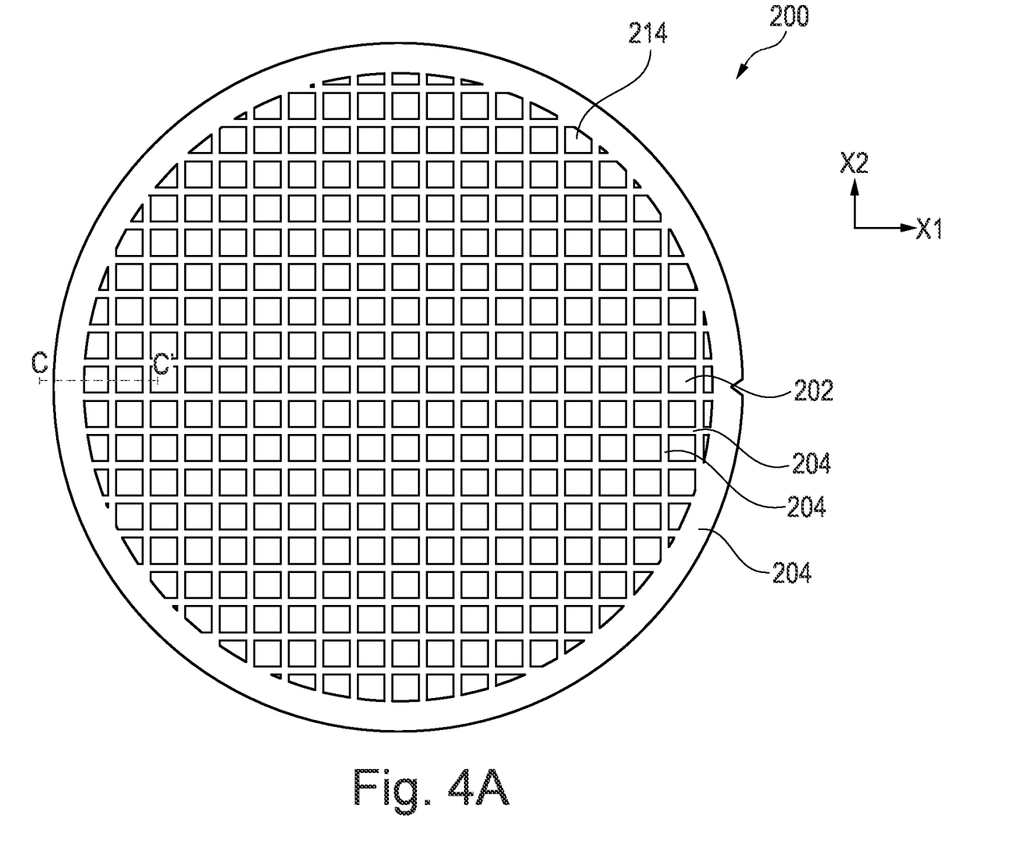
Figure 4B:
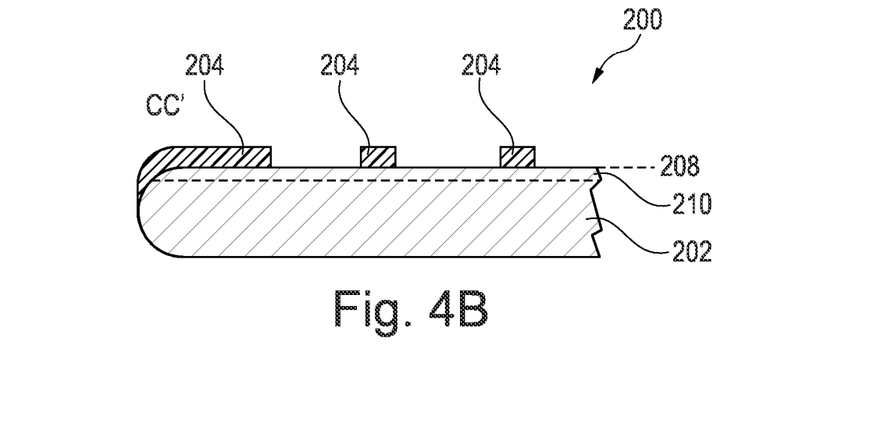

Referring to the example illustrated in the schematic top view of FIG. 4A and the corresponding cross-sectional view of FIG. 4B, the bonding material 204 is also arranged along an edge of the carrier body 202 similar to the example of FIGS. 2A, 2B. However, the bonding material 204 is further arranged in the shape of parallel stripes extending along a first lateral direction x1 and further extending along a second lateral direction x2. Areas 214 that are laterally confined by the stripe-shaped bonding material 204 may correspond to die areas of the semiconductor wafer, for example. The stripe-shaped bonding material 204 may be arranged in a kerf area of the semiconductor wafer, for example. The kerf area is an area that is removed when separating the semiconductor wafer into separate chips or dies by a dicing process, for example. Similar to the example illustrated in FIGS. 3A, 3B, the bonding material 204 in the example of FIGS. 4A, 4B may also be in the shape of ring segments 2041 with channels 212 between neighboring ring segments 2041, for example.

Figure 5A:
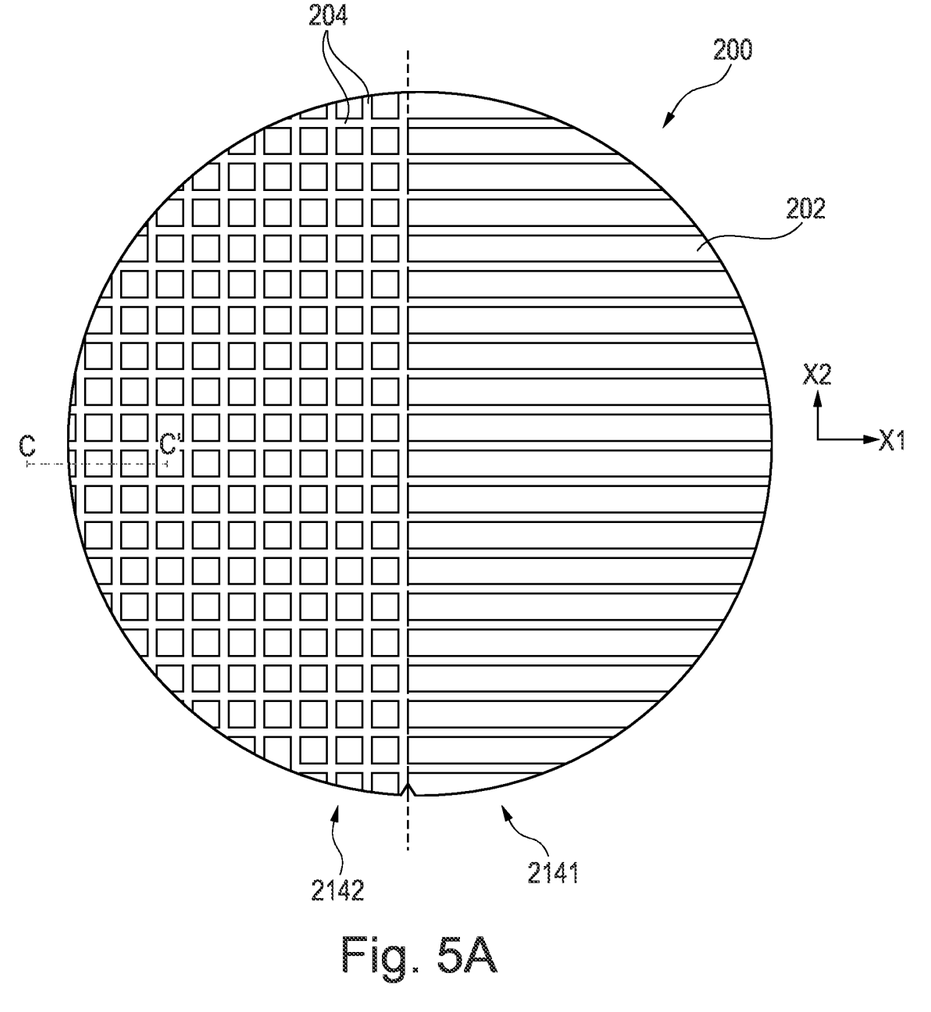
Figure 5B:
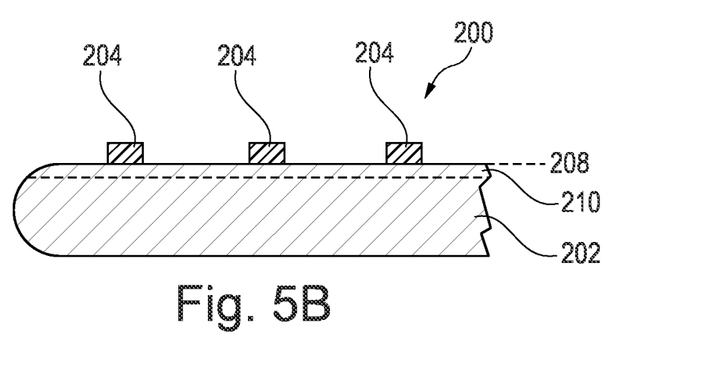

Referring to the example illustrated in the schematic top view of FIG. 5A and the corresponding cross-sectional view of FIG. 5B, the bonding material 204 is arranged in the shape of parallel stripes extending along a first lateral direction x1 and further extending along a second lateral direction x2. In some areas of the carrier 200, e.g. a first area 2141, the bonding material 204 is arranged as parallel stripes extending in only one of the first lateral direction x1 and the second lateral direction x2. In some other areas, e.g. a second area 2142, the bonding material 204 is arranged as parallel stripes extending along both of the first lateral direction x1 and the second lateral direction x2. In other words, the bonding material 204 may be arranged in the shape of a grid in some areas of the carrier 200, e.g. the second area 2142, and may be arranged in the shape of parallel stripes extending along one lateral direction in other areas, e.g. the first area 2141.

Number, dimensions and arrangement of grid-shaped and stripe-shaped areas may differ from the exemplary and specific arrangement of FIGS. 5A, 5B. For example, the first area 2141 may allow for an enhanced carrier release via a wet etch compared with the grid-shaped arrangement of the bonding material 204 in the second area 2142.

Figure 6A:
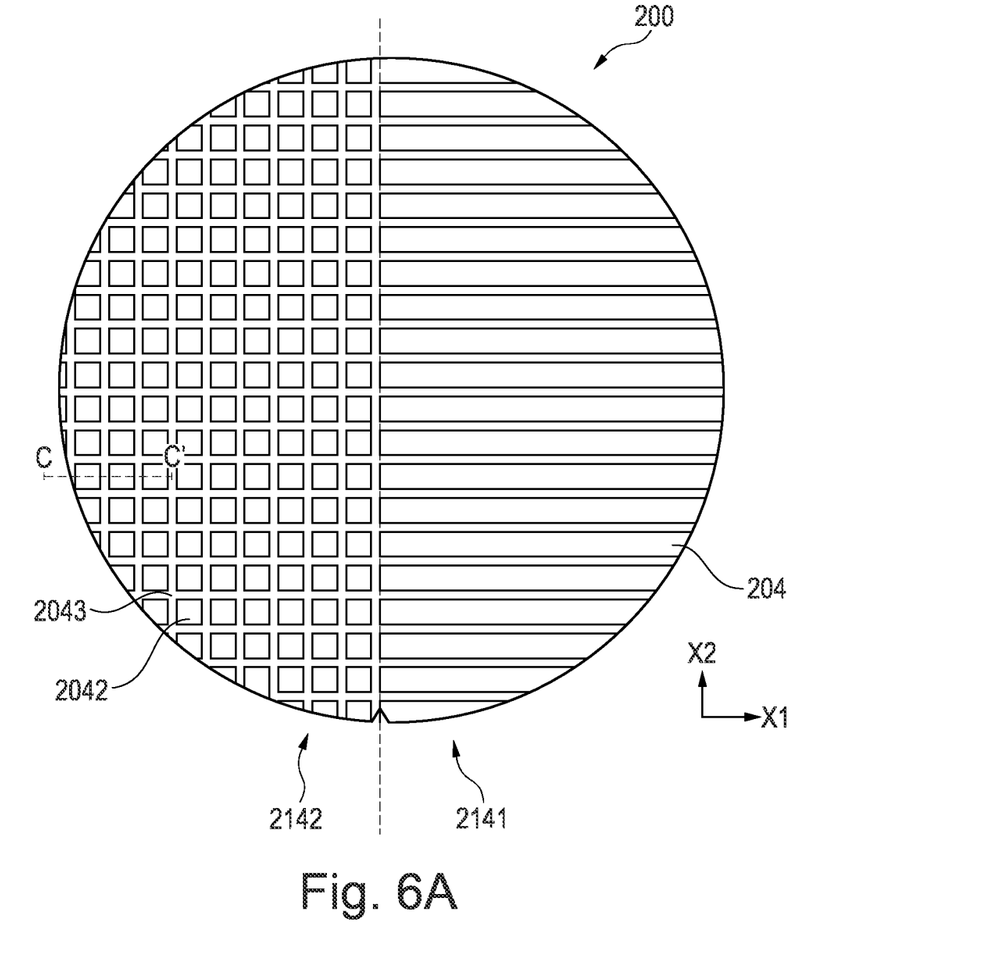
Figure 6B:
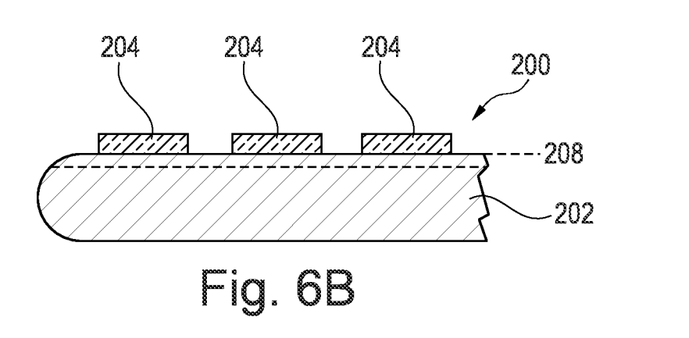

Referring to the example illustrated in the schematic top view of FIG. 6A and the corresponding cross-sectional view of FIG. 6B, the bonding material 204 is arranged in the shape of parallel stripes extending along the first lateral direction x1 in the first area 2141 of the carrier 200. The bonding material 204 is further arranged as separate islands 2042 in the second area 2142 of the carrier 200. The islands 2042 may be bonded to an area of the semiconductor wafer where dies or chips are integrated, and spaces between the islands 2042, 2043 may be opposed to a kerf area of the semiconductor wafer, for example.

In the example illustrated in the schematic top view of FIG. 6A and the corresponding cross-sectional view of FIG. 6B, the dopants are integrated into the bonding material 204. Thus, the bonding material 204 is configured as a doping source.

Number, dimensions and arrangement of island-shaped and stripe-shaped areas may differ from the exemplary and specific arrangement of FIGS. 6A, 6B.

FIGS. 7A to 9 are schematic cross-sectional views for illustrating examples of methods of manufacturing power semiconductor devices.

Figure 7A:
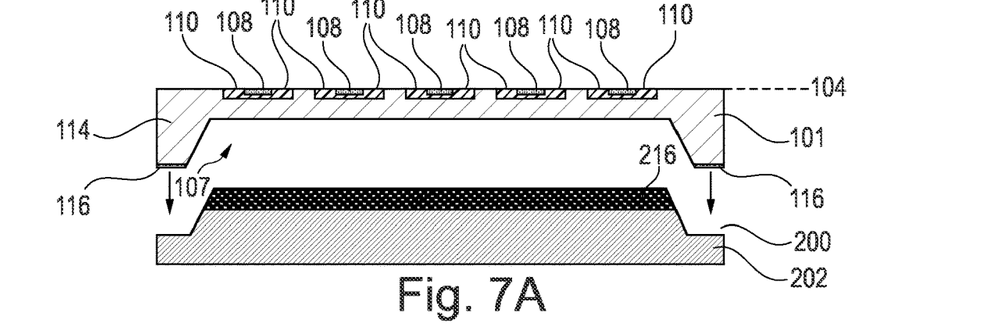

Referring to the example illustrated in FIG. 7A, active device elements 108 are formed in a semiconductor wafer 101 at a first main surface 104 of the semiconductor wafer 101. Edge termination elements 110 are formed and at least partly surround the active device elements 108 at the first main surface 104. Before forming a wiring area including metallization layer(s) above the first main surface 104, a thickness of the semiconductor wafer 101 is reduced at a second side 107 opposite to the first main surface 104. A ring 114 at a circumference of the semiconductor wafer 114 may be excluded from material removal for increasing mechanical stability of the thinned semiconductor wafer 101. A bonding material 116 may be formed on the ring 114. As an alternative or in addition, a bonding material may also be formed on the carrier 200, for example.

The carrier 200 has a shape that is adapted to the thinned semiconductor wafer 101. Thus, the carrier has a reduced thickness at a circumference of the carrier body 202. The carrier 200 may include dopants in a surface part 216.

Figure 7B:
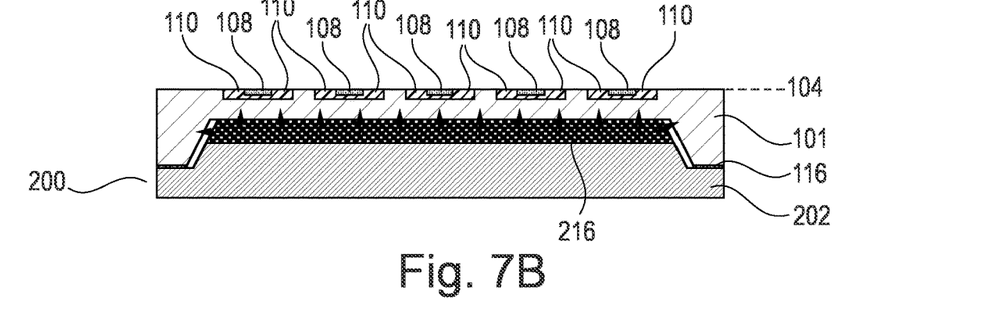

Referring to the example illustrated in FIG. 7B, the semiconductor wafer 101 is bonded to the carrier 200 via the second side 107 of the semiconductor wafer 101. In some examples, bonding of the semiconductor wafer 101 to the carrier 200 leads to a direct contact between the surface part 216 of the carrier 200 and the second side 107 of the semiconductor wafer 101. In some other examples, the surface part 216 of the carrier 200 not directly contacts the second side 107 of the semiconductor wafer 101 after bonding. Thus, an empty space remains between the surface part 216 of the carrier 200 and the second side 107 of the semiconductor wafer 101 after bonding. In this case, the dopants from the carrier may enter the empty space, i.e. gas phase, and the semiconductor wafer 101 at the second side 107 is doped via the gas phase. The doping process is schematically illustrated by arrows in FIG. 7B. Doping at high temperatures, e.g. temperatures above 600° C., is possible since no wiring area, i.e. metallization layer(s), are yet formed above the first main surface 104 of the semiconductor wafer 101.

After the thermal process, the carrier 200 may remain at the second side 107 of the semiconductor wafer 101 for increasing mechanical stability during subsequent processing at the first main surface 104 of the semiconductor wafer 101, e.g. during formation of dielectric layer(s) and metallization layer(s) of a wiring area above the first main surface 104 of the semiconductor wafer 101.

Figure 7C:
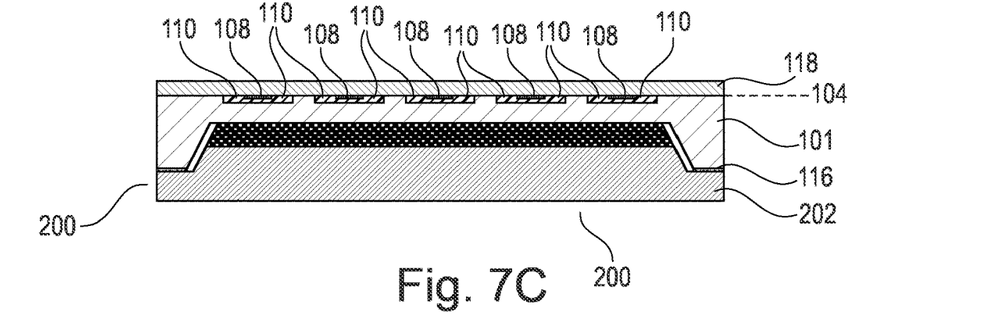
Figure 7D:
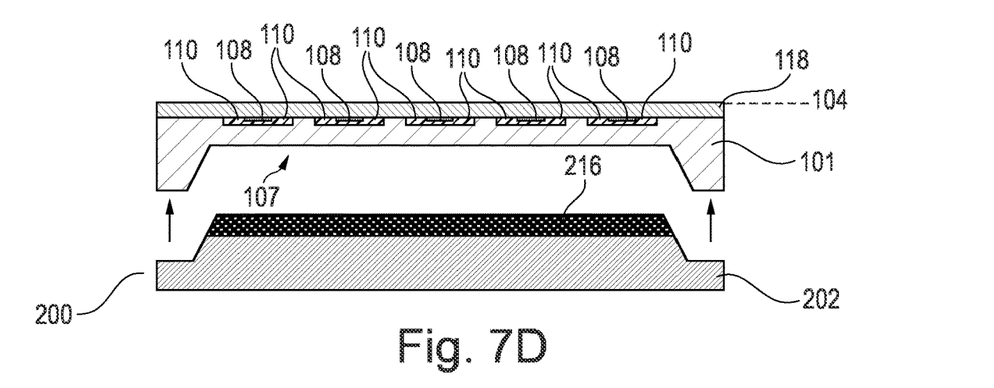

Referring to the examples illustrated in FIGS. 7C and 7D, when the carrier 200 is no longer required at the second side 107 of the semiconductor wafer 101, e.g. before forming a metal layer at the second side 107 of the semiconductor wafer 101, the semiconductor wafer 101 is separated from the carrier 200. Depending on requirements, a protection layer 118 may be formed over the first surface 104 of the semiconductor wafer 101, e.g. on a wiring area of the semiconductor wafer 101. For example, the protection layer 118 may protect the first surface 104 of the semiconductor wafer 101 from damage by an etch solution, e.g. fluorine containing etching solutions, when separating the semiconductor wafer 101 from the carrier 200 by etching the bonding material 116. After separation of the carrier 200, the carrier 200 may be recycled, for example. For example, the carrier 200 may be reused as a doping source when introducing dopants into the surface part 216 again, e.g. by means of one or more ion implantation processes and/or diffusion processes. For example, a portion of the surface part 216 may be removed.

Figure 8A:
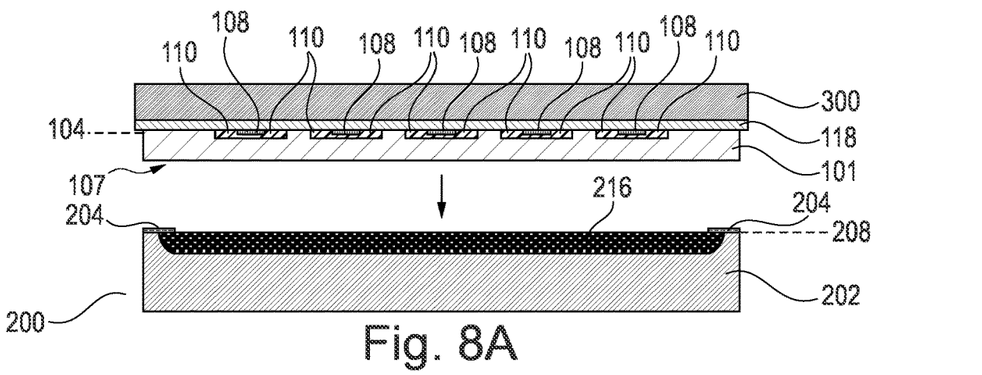
Figure 8B:
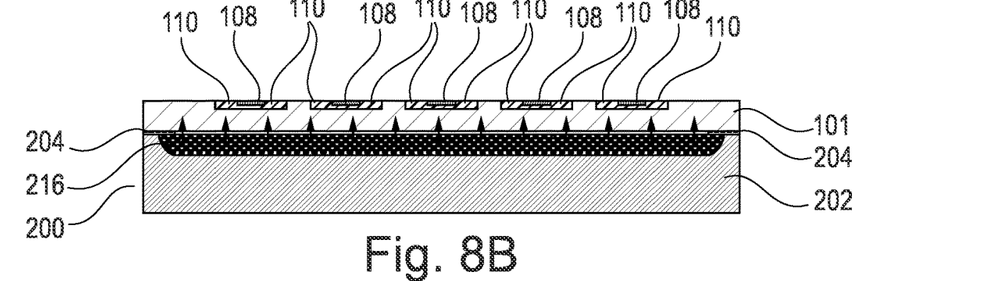
Figure 8C:
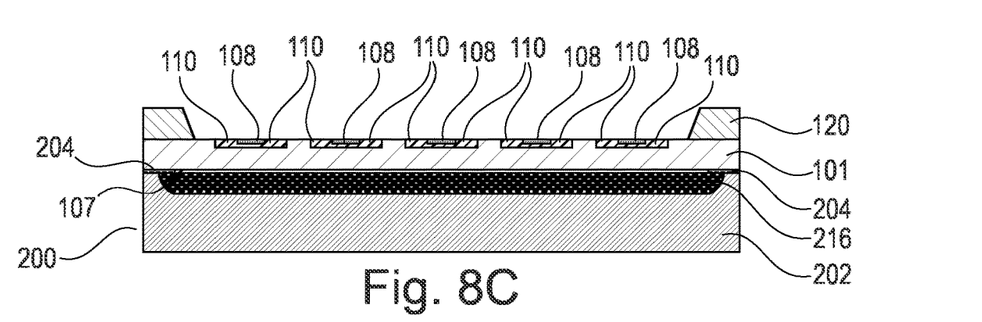
Figure 9:
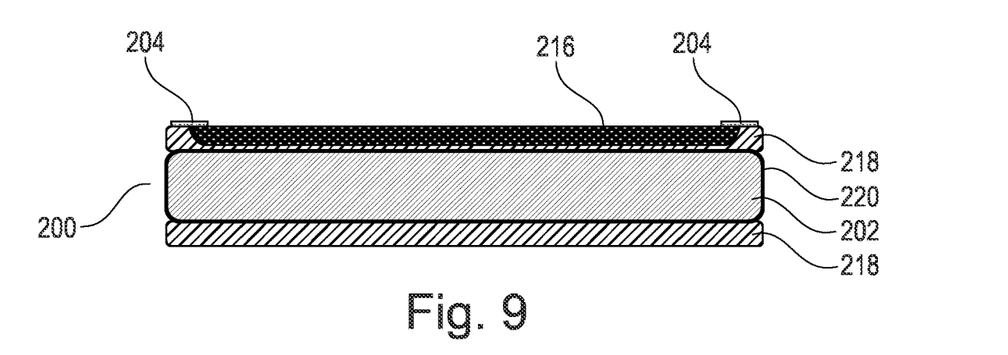

Another example of manufacturing a power semiconductor device is illustrated in the schematic cross-sectional views of FIGS. 8A to 8C. The example of FIGS. 8A to 8C does not require any preparation of the carrier 200 or semiconductor wafer 101 by masked material removal for leaving a ring on the semiconductor wafer 101 for increasing mechanical stability for subsequent processing. Also, complexity when aligning the semiconductor wafer 101 to the carrier 200 may be reduced compared with the example of FIGS. 7A to 7D.

Referring to the cross-sectional view of FIG. 8A, the semiconductor wafer 101 is attached to an auxiliary carrier 300 via the first main surface 104 before forming a wiring area including metallization layer(s) above the first main surface 104 of the semiconductor wafer 101. In the semiconductor wafer 101, active device elements are formed at a first main surface 104 of the semiconductor wafer 101. Edge termination elements 110 are formed and at least partly surround the active device elements 108 at the first main surface 104. A thickness of the semiconductor wafer 101 is reduced at a second side 107 opposite to the first main surface 104. During the process of thinning the semiconductor wafer 101, the auxiliary carrier 300 mechanically supports the workpiece.

In the carrier 200, the dopants are formed in the surface part 216. The dopants may be introduced into the surface part 216 by one or more ion implantation processes, for example. When implanting multiple dopants, e.g. donors and acceptors and/or dopants having different diffusion coefficients such as boron and selenium for IGBTs or phosphorus and selenium for diodes, the manufacturing method enables formation of functionally different semiconductor regions such as rear side emitter regions and field stop regions by a common processing step, i.e. a common diffusion step. For example, when forming field stop regions by using selenium, deep energy levels of selenium in the bandgap of silicon may further allow for improving electric characteristics of the power semiconductor devices due to thermal activation. In this way, electric characteristics such as hot leakage current, softness and/or short circuit robustness may be improved, for example.

The bonding material 204 is formed on the first main surface 208. For example, the bonding material 204 may correspond to a hard mask previously used when introducing the dopants into the surface part 216 of the carrier 200. Details on bonding material(s) and bonding techniques described with reference to the examples above likewise apply.

After bonding the semiconductor wafer 101 to the carrier 200, the auxiliary carrier 300 is removed and the dopants are introduced from the surface part 216 of the carrier 200 into the semiconductor wafer 101 by a diffusion process as described with reference to the example illustrated in FIGS. 7A to 7D, for example.

Thereafter and before forming one or more metallization layers at the second side 107 of the semiconductor wafer 101, a wiring area may be formed above the first main surface 104 of the semiconductor wafer. A mechanical support, e.g. a support ring 120 may be formed above the first main surface 104 of the semiconductor wafer 101 for providing mechanical stability. The support ring 120 provides mechanical support for further processing of the semiconductor wafer, e.g. for processing the second side 107 of the semiconductor wafer 101 when the carrier 200 is removed.

Further processing may follow for finalizing the power semiconductor devices, e.g. dicing the semiconductor wafer 101 into dies or chips and chip packaging.

In the examples described above, the dopants may be introduced into surface part 216 of the carrier 200 by one or more masked or unmasked ion implantation processes. This allows for forming different doping sources, e.g. doping sources that may differ with respect to number and/or type and/or concentration of dopants across the first main surface 208 of the carrier 200. Thereby, semiconductor regions having different functionality may be formed by a common diffusion process at the second side 107 of the semiconductor wafer 101. For example, doped regions for high dynamic robustness (HDR) in an edge region of the IGBT dies, rear side emitter regions, patterned p$^+$-doped stripes for short-circuit improvement or some rear side emitter regions having high doping concentration for softness improvement may be formed by a common diffusion process as described in the examples above.

When forming power semiconductor diodes life-time killing processes involving platinum may be challenging due to strong diffusion of platinum. Diffusion of the platinum into the inside of the carrier 200 reduces the platinum concentration that is available for doping the semiconductor wafer 101. The carrier 200 illustrated in the cross-sectional view of FIG. 9 may avoid diffusion of dopants into the interior of the carrier 200. The carrier 200 includes a semiconductor layer 218 over the carrier body 202, e.g. above a front and/or rear side of the carrier body 202. The dopants are included in the semiconductor layer 218 and the bonding material 204 is arranged on the semiconductor layer 218. The carrier 200 further includes a diffusion barrier 220 arranged between the semiconductor layer 218 and the carrier body 200. The diffusion barrier 220 hinders the dopants in the semiconductor layer 218 from diffusing into the inside of the carrier body 202. In other words, the dopants may contribute to doping of the semiconductor wafer 101 instead of diffusing into the inside of the carrier body 202. For example, the diffusion barrier 220 may be formed of SiC. The semiconductor layer 218 may be a polycrystalline silicon layer, for example. The carrier body 202 may also be formed of SiC or polycrystalline SiC, for example.

The aspects and features mentioned and described together with one or more of the previously described examples and figures, may as well be combined with one or more of the other examples in order to replace a like feature of the other example or in order to additionally introduce the feature to the other example.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A vertical power semiconductor device, comprising:
   a semiconductor body having a first main surface and a second main surface opposite to the first main surface, wherein a thickness of the semiconductor body between the first main surface and the second main surface ranges from 40 µm to 200 µm;
   active device elements in the semiconductor body at the first main surface;
   edge termination elements at least partly surrounding the active device elements at the first main surface; and
   a diffusion region extending into the semiconductor body from the second main surface, wherein a doping concentration profile of the diffusion region decreases from a peak concentration Ns at the second main surface to a concentration Ns/e, e being Euler's number, over a vertical distance ranging from 1 µm to 5 µm.

2. The vertical power semiconductor device of claim 1, wherein the semiconductor body is a magnetic Czochralski (MCZ) or a float zone (FZ) silicon semiconductor body.

3. The vertical power semiconductor device of claim 1, wherein a Gaussian function or complementary error function fits to the doping concentration profile of the diffusion region.

4. The vertical power semiconductor device of claim 1, wherein the diffusion region is a rear side emitter region of a power insulated gate bipolar transistor, or an anode or cathode contact region of a power semiconductor diode.

5. A semiconductor wafer or a bare-die arrangement comprising a plurality of semiconductor dies, wherein at least some of the plurality of semiconductor dies comprise the vertical power semiconductor device of claim 1.

6. The semiconductor wafer of claim 5, wherein a diameter of the semiconductor wafer is equal to 200 mm or larger.

7. A carrier, comprising:
a carrier body;
a bonding material on a first main surface of the carrier body, wherein the carrier is configured to be attached to a semiconductor wafer by wafer bonding via the bonding material; and
dopants integrated in a first part of the carrier at the first main surface, wherein the dopants are configured to exit the carrier by thermal processing, and are configured to form n-type or p-type doping in the semiconductor wafer,
wherein an arrangement of the bonding material on the first main surface of the carrier body includes one or more of a ring or ring segments along a circumference of the carrier body, a pattern of regularly arranged islands, and a plurality of stripes arranged in parallel.

8. The carrier of claim 7, wherein the carrier is disc-shaped having a diameter equal to 200 mm or larger.

9. The carrier of claim 7, wherein the carrier body includes one or more of silicon, borophosphosilicate glass, borosilicate glass, phosphosilicate glass, boron nitride, polycrystalline silicon, and silicon carbide.

10. The carrier of claim 7, wherein the dopants are included in the bonding material.

11. The carrier of claim 7, wherein the dopants are included in a semiconductor region of the carrier body at the first main surface.

12. The carrier of claim 7, wherein the dopants are introduced by at least one of an ion implantation step or a diffusion step.

13. The carrier of claim 7, further comprising:
a semiconductor layer over the carrier body, wherein the dopants are included in the semiconductor layer, and the bonding material is arranged on the semiconductor layer; and
a diffusion barrier arranged between the semiconductor layer and the carrier body.

14. A method of manufacturing a vertical power semiconductor device, the method comprising:
forming active device elements in a semiconductor wafer at a first main surface of the semiconductor wafer;
forming edge termination elements at least partly surrounding the active device elements at the first main surface;
reducing a thickness of the semiconductor wafer at a second side opposite to the first main surface;
bonding the semiconductor wafer to a carrier via the second side; and
introducing dopants from the carrier into the semiconductor wafer through a second main surface of the semiconductor wafer at the second side.

15. The method of claim 14, wherein the thickness of the semiconductor wafer is reduced by removing material of the semiconductor wafer from the second side of the semiconductor wafer.

16. The method of claim 14, wherein the thickness of the semiconductor wafer is reduced by separating the semiconductor wafer in a first part and a second part by a wafer split process.

17. The method of claim 14, wherein the vertical power semiconductor device comprises a diffusion region extending into the semiconductor wafer from the second side, wherein a doping concentration profile of the diffusion region decreases from a peak concentration Ns at the second side to a concentration Ns/e, e being Euler's number, over a vertical distance ranging from 1 μm to 5 μm, and wherein the diffusion region is formed by introducing the dopants from the carrier into the semiconductor wafer.

18. The method of claim 14, wherein the carrier includes a carrier body and a bonding material on a first main surface of the carrier body, wherein the carrier is attached to the semiconductor wafer via the bonding material, and wherein the dopants are integrated in a first part of the carrier at the first main surface and exit the carrier by thermal processing to form n-type or p-type doping in the semiconductor wafer.

19. The method of claim 14, further comprising:
separating the semiconductor wafer from the carrier by at least one etch process removing at least part of a bonding material.

20. The method of claim 14, wherein the thickness of the semiconductor wafer is reduced in a central region of the semiconductor wafer, and wherein a thickness of a ring of the semiconductor wafer at a circumference of the semiconductor wafer is maintained.

21. The method of claim 14, further comprising:
attaching a mechanical support element over the first main surface of the semiconductor wafer.

22. A method of manufacturing a vertical power semiconductor device, the method comprising:
forming active device elements in a semiconductor wafer at a first main surface of the semiconductor wafer;
forming edge termination elements at least partly surrounding the active device elements at the first main surface;
reducing a thickness of the semiconductor wafer at a second side opposite to the first main surface;
after reducing the thickness of the semiconductor wafer, bonding the semiconductor wafer to a carrier via the second side; and
before bonding the semiconductor wafer to the carrier, introducing dopants into the semiconductor wafer through a second main surface of the semiconductor wafer at the second side.

23. The method of claim 22, wherein the dopants are introduced into the second main surface of the semiconductor wafer by ion implantation.

24. The method of claim 22, wherein a diameter of the semiconductor wafer is equal to 200 mm or larger.

25. A method of manufacturing a vertical power semiconductor device, the method comprising:
forming active device elements in a semiconductor wafer at a first main surface of the semiconductor wafer;
after forming the active device elements, reducing a thickness of the semiconductor wafer at a second side opposite to the first main surface;
after reducing the thickness of the semiconductor wafer, bonding the semiconductor wafer to a carrier via the second side; and
after bonding the semiconductor wafer to the carrier, subjecting the semiconductor wafer to a thermal treatment of at least 600° C.

26. The method of claim 25, wherein a diameter of the semiconductor wafer is equal to 200 mm or larger.

27. A method of manufacturing a vertical power semiconductor device, the method comprising:
- forming active device elements in a semiconductor wafer at a first main surface of the semiconductor wafer;
- reducing a thickness of the semiconductor wafer at a second side opposite to the first main surface;
- after reducing the thickness of the semiconductor wafer, bonding the semiconductor wafer to a carrier via the second side;
- after bonding the semiconductor wafer to the carrier, applying a metallization layer on the first main surface prior to removing the carrier.

28. The method of claim 27, wherein a diameter of the semiconductor wafer is equal to 200 mm or larger.

* * * * *